(12) United States Patent
Saito et al.

(10) Patent No.: US 7,385,228 B2
(45) Date of Patent: Jun. 10, 2008

(54) SEMICONDUCTOR LIGHT-EMITTING ELEMENT AND LIGHT-EMITTING DEVICE

(75) Inventors: Shinji Saito, Yokohama (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 180 days.

(21) Appl. No.: 11/352,365

(22) Filed: Feb. 13, 2006

(65) Prior Publication Data
US 2006/0214171 A1    Sep. 28, 2006

(30) Foreign Application Priority Data
Feb. 14, 2005   (JP)   ............... 2005-036573

(51) Int. Cl.
*H01L 27/15*   (2006.01)
*H01L 31/12*   (2006.01)
*H01L 33/00*   (2006.01)
(52) U.S. Cl. .................. 257/98; 257/79; 257/E33.072
(58) Field of Classification Search .......... 257/79–103, 257/E33.072
See application file for complete search history.

(56) References Cited
U.S. PATENT DOCUMENTS
6,541,291 B2 *   4/2003   Kuniyasu ................. 257/79

6,710,375 B2 *   3/2004   Oshima ................. 257/88

FOREIGN PATENT DOCUMENTS
| JP | 2000-332300 | 11/2000 |
|----|-------------|---------|
| JP | 2002-100830 | 4/2002 |
| JP | 2004-179644 | 6/2004 |

OTHER PUBLICATIONS
U.S. Appl. No. 11/352,365, filed Feb. 13, 2006, Saito et al.
U.S. Appl. No. 11/365,531, filed Mar. 2, 2006, Tachibana et al.

* cited by examiner

*Primary Examiner*—Cuong Nguyen
(74) *Attorney, Agent, or Firm*—Oblon, Spivak, McClelland, Maier & Neustadt, P.C.

(57) ABSTRACT

A semiconductor light-emitting element has a laminated section which has an active layer made of a semiconductor, and first and second clad layers each being disposed to sandwich the active layer and made of a semiconductor, a pair of first high-reflection layers each being disposed to sandwich the active layer in a first direction orthogonal to the laminated direction of the laminated section, and a low-reflection layer and a second high-reflection layer each being disposed to sandwich the active layer in a second direction orthogonal to the laminated direction and crossing to the first direction.

19 Claims, 5 Drawing Sheets

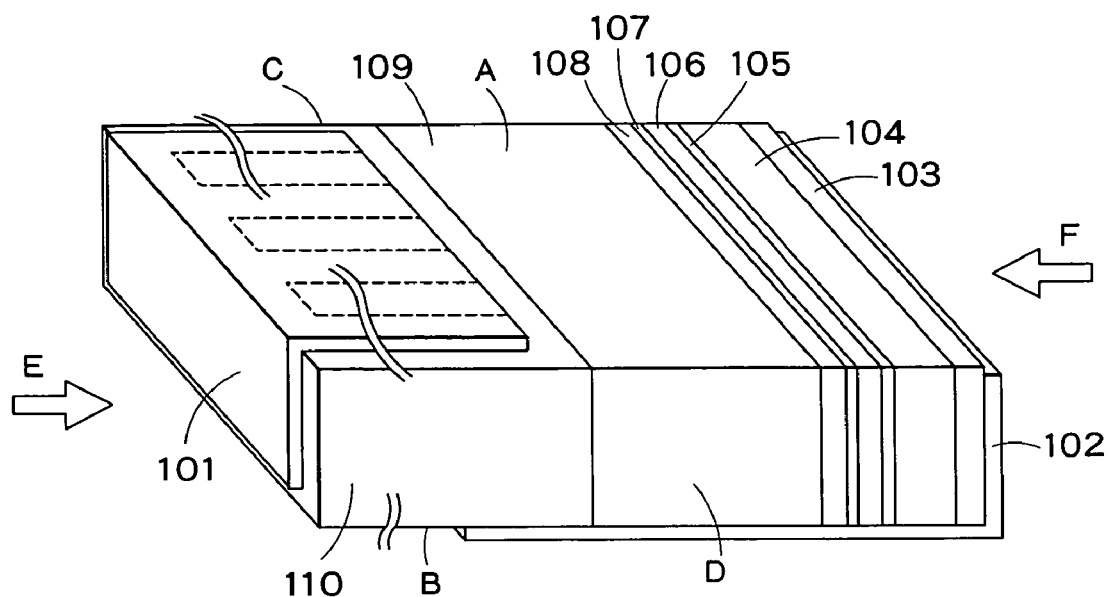
F I G. 1
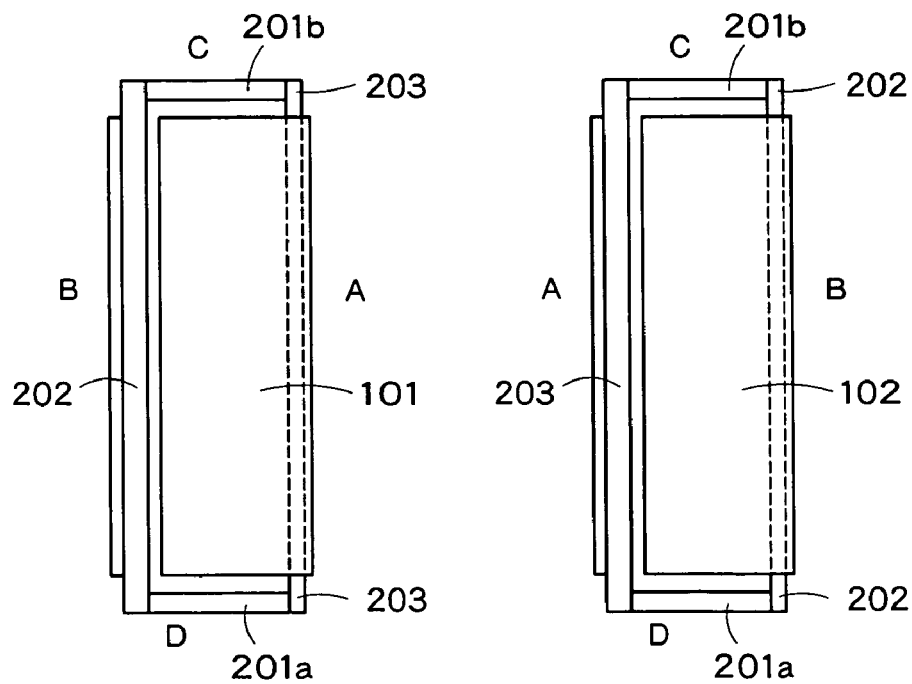
F I G. 2A    F I G. 2B

FIG. 3E

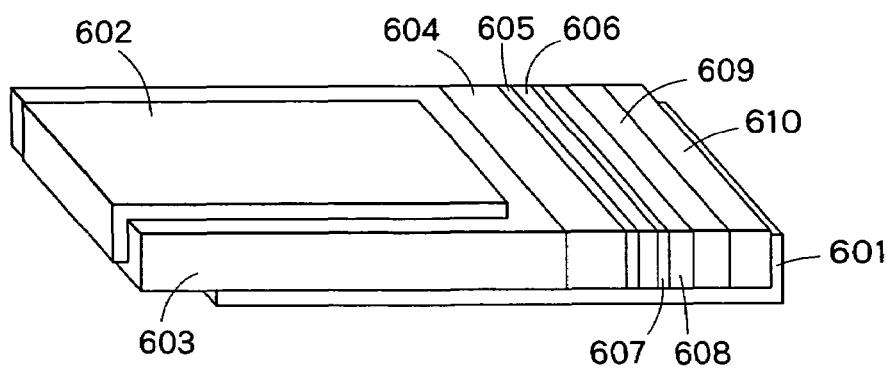
F I G. 6
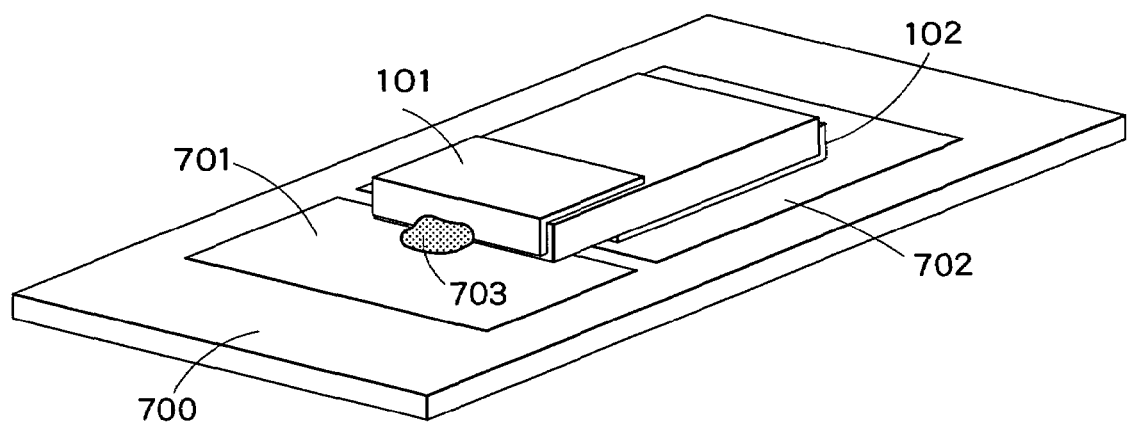
F I G. 7

SEMICONDUCTOR LIGHT-EMITTING ELEMENT AND LIGHT-EMITTING DEVICE

CROSS REFERENCE TO RELATED APPLICATIONS

This application is based upon and claims the benefit of priority from the prior Japanese Patent Application N0. 2005-36573, filed on Feb. 14, 2005, the entire contents of which are incorporated herein by reference.

BACKGROUND OF THE INVENTION

1. Field of the Invention

The present invention relates to a light-emitting element and a light-emitting device and, particularly, to a semiconductor light-emitting element and a light-emitting device in which a semiconductor material is used.

2. Related Art

Semiconductor light-emitting elements are widely used in display devices, lighting devices, recording devices, etc. Particularly, semiconductor light-emitting diodes (LEDs) which do not use stimulated emission are used as display devices because of their high luminance. As a recent new application, trials have been made to use an LED as a lighting device in which an LED and a fluorescent material layer are combined (refer to the Japanese Patent Laid-Open No. 2004-179644, for example). This publication discloses a fluorescent-material laminated structure in which two kinds of fluorescent material layers are laminated on a semiconductor light-emitting element such as an LED, in order to increase color rendering properties, and a light-emitting device of white color etc. in which this fluorescent-material laminated structure is used. In the fluorescent material layers of this light-emitting device, a diffusion agent, a binder resin and a fluorescent material are blended by being adjusted. This increases luminous efficiency and suppresses the deterioration of the fluorescent material layers.

In the conventional light-emitting device described in the above-cited publication, the lighting device in which an LED and fluorescent material layers are combined intends to improve the luminance of the lighting device by contriving the material and structure of the fluorescent material layers. However, the conventional technique is sufficient for use in a lighting device. That reason will be described below.

LEDs are excellent in high efficiency and small heat generation, compared to the existing electric lamps. Therefore, it is assumed that the existing electric lamps will be more and more replaced in the future by combinations of an LED and a high-luminance fluorescent material layer. On the other hand, compared to fluorescent lamps which are widely used as lighting devices, LEDs have still problems in efficiency, heat generation and operating power source, and even when high-luminance fluorescent material layers are used, it will be practically difficult to obtain an excellent luminous efficiency (luminous efficiency relative to input power) enough to replace the fluorescent lamps. Thus, conventional LEDs have the problem that they are not sufficient in terms of efficiency, heat generation and operating power source and that it is difficult to obtain an excellent luminous efficiency enough to replace the fluorescent lamps which are widely used as lighting devices.

SUMMARY OF THE INVENTION

In order to solve the above-described problem, an object of the present invention is to provide a semiconductor light-emitting element and a light-emitting device having a high light-emitting efficiency relative to an input power.

According to one embodiment of the present invention, a semiconductor light-emitting element, comprising:

a laminated section which has an active layer made of a semiconductor, and first and second clad layers each being disposed to sandwich the active layer and made of a semiconductor;

a pair of first high-reflection layers each being disposed to sandwich the active layer in a first direction orthogonal to the laminated direction of the laminated section, which have high reflectance relative to a light emitted by the active layer; and a low-reflection layer and a second high-reflection layer each being disposed to sandwich the active layer in a second direction orthogonal to the laminated direction and crossing to the first direction, which have low reflectance and high reflectance respectively relative to the light emitted by the active layer.

Furthermore, according to one embodiment of the present invention, a light-emitting device, comprising:

a mount substrate which has a heat sink; and a semiconductor light-emitting element mounted on the heat sink, wherein the semiconductor light-emitting element has:

a laminated section which has an active layer made of a semiconductor, and first and second clad layers each being disposed to sandwich the active layer and made of a semiconductor;

a pair of first high-reflection layers each being disposed to sandwich the active layer in a first direction orthogonal to the laminated direction of the laminated section, which have high reflectance relative to a light emitted by the active layer; and a second high-reflection layer each being disposed to sandwich the active layer in a second direction orthogonal to the laminated direction and crossing to the first direction, which have low reflectance and high reflectance respectively relative to the light emitted by the active layer, the laminated direction of the laminated section being disposed in parallel to a surface on which the semiconductor light-emitting element on the heat sink is disposed.

BRIEF DESCRIPTION OF THE DRAWINGS

FIG. 1 is a perspective view which shows a structure of a semiconductor light-emitting element according to the first embodiment of the present invention.

FIG. 2A is a side view as viewed from the n-side electrode 101 side, and FIG. 2B is a side view as viewed from the p-side electrode 102 side.

FIG. 3A-3H are perspective views which shows a method of manufacturing a semiconductor light-emitting element of this embodiment.

FIG. 6 is a perspective view which shows a structure of a semiconductor light-emitting element related to this embodiment.

FIG. 7 is a perspective view which shows an example in which the semiconductor light-emitting element of FIG. 1 is mounted on a printed circuit board.

DETAILED DESCRIPTION OF THE INVENTION

Figure 3A:
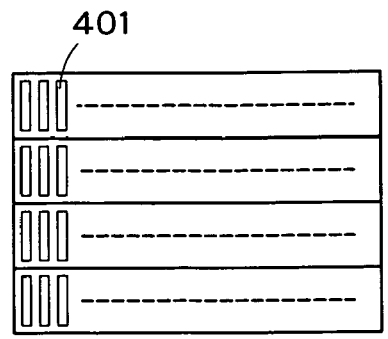

Hereinafter, embodiments of the present invention will be described in detail with reference to the drawings.

First Embodiment

FIG. 1 is a perspective view which shows a structure of a semiconductor light-emitting element according to the first embodiment of the present invention. The semiconductor light-emitting element shown in FIG. 1 is provided with a GaN-based compound semiconductor chip in a rectangular shape. This chip has a structure which is obtained by laminating a p-type GaN contact layer 103 doped with Mg, a p-type $Al_{0.05}Ga_{0.95}N$ clad layer 104 doped with Mg, a p-type $Al_{0.2}Ga_{0.8}N$ overflow preventing layer 105 doped with Mg, a GaN guide layer 106 which is not doped, an active layer 107 having a multi-quantum well structure in which a well layer is $In_{0.2}Ga_{0.8}N$ and a barrier layer is $In_{0.03}Ga_{0.97}N$, an n-type GaN guide layer 108 doped with Si, an n-type $Al_{0.05}Ga_{0.95}N$ clad layer 109 doped with Si, and an n-type GaN contact layer 110 doped with Si in this order.

A p-side electrode 102 is connected to the p-type GaN contact layer 103, and an n-side electrode 101 is connected to the n-type GaN contact layer 110. The p-side electrode 102 is disposed along two surfaces of the chip, and the n-side electrode 101 is also disposed along two surfaces of the chip. As indicated by solid lines, the n-side electrode 101 on the surface A side has the shape of a rectangle. A comb shape indicated by dotted lines within the n-side electrode 101 will be described later.

Multiple surfaces of the GaN-based compound semiconductor chip shown in FIG. 1 (the four surfaces A, B, C and D except the surface on which the n-side electrode 101 is provided and the surface on which the p-side electrode 102 is provided) are provided with either a high-reflection layer or a low-reflection layer. FIG. 2A is a side view as viewed from the n-side electrode 101 side (from the direction E), and FIG. 2B is a side view as viewed from the p-side electrode 102 side (from the direction F).

As shown in FIG. 2A, the surface of the GaN-based compound semiconductor chip on the side A is provided with a low-reflection layer 203, and the surface thereof on the side B is provided with a high-reflection layer 202. Also, the surface on the side C and the surface on the side D are respectively provided with high-reflection layers 201b, 201a. These high-reflection layers 201b, 201a, 202 and low-reflection layer 203 are omitted in FIG. 1.

The low-reflection layer 203 is formed of a dielectric multilayer film or the like and for example, $SiO_2$, SiN, $Al_2O_3$, etc. can be used. The reflectance of the low-reflection layer 203 in this embodiment is, for example, 10%. The high-reflection layers 201b, 201a, 202 are formed of a dielectric multilayer film or the like, and for example, a laminated film in which $TiO_2/SiO_2$ is repeatedly formed or the like can be used. The film thickness of $TiO_2$ and $SiO_2$ is a thickness corresponding to ¼ of a central wavelength of the light-emitting layer (the active layer 107). Although the number of repetitions can be, for example, 10 pairs in all, it is not limited to this figure. In this embodiment, the reflectance of the high-reflection layers is, for example, 99%.

The above-described high-reflection layers 201a, 201b are disposed on both end surfaces in the first direction (the direction which connects C and D) orthogonal to the lamination direction of a laminated section which has the active layer 107, the n-type $Al_{0.05}Ga_{0.95}N$ clad layer 109 and the p-type $Al_{0.05}Ga_{0.95}N$ clad layer 104, and have a high reflectance relative to the light generated in the active layer 107.

The above-described low-reflection layer 203 and high-reflection layer 202 are provided on both end surfaces by sandwiching the active layer 107 in the second direction (the direction which connects A and B) which is orthogonal to the above-described lamination direction and intersects the first direction, and have a low reflectance and a high reflectance relative to the light generated in the active layer 107, respectively.

When a current flow through the semiconductor light-emitting element of FIG. 1, a waveguide structure is formed by the n-type $Al_{0.05}Ga_{0.95}N$ clad layer 109 and the p-type $Al_{0.05}Ga_{0.95}N$ clad layer 104, and the light can be trapped in the active layer 107. At the same time, the light is caused to resonate by the pair of high-reflection layers 201a, 201b each having a high reflectance. Because the active layer 107 has a gain, it is possible to suppress the absorption of light caused when the light emitted by the active layer 107 crosses again the active layer 107 due to internal reflection (multiple reflection).

Because the low-reflection layer 203 and the high-reflection layer 202 are provided so that light can be taken out in a direction which intersects the direction of oscillation, it is possible to increase the luminous efficiency of the element twice or so by taking out the light emitted in the active layer 107 to the outside via the low-reflection layer 203.

Also, the semiconductor light-emitting element according to the present embodiment has an element shape of which the length in a direction perpendicular to both the above-described lamination direction and the second direction (the direction which connects A and B), in other words, the length in the depth direction of FIG. 1, i.e., the first direction, is larger than the length in the direction perpendicular to both this lamination direction and the first direction (the direction which connects C and D), in other words, the length in the vertical direction of FIG. 1, i.e., the second length. In the case of this element shape, the sectional area of the active layer 107 on a surface perpendicular to the second direction is larger than the sectional area of the active layer 107 on a surface perpendicular to the first direction. Therefore, the area of the light-emitting region in the light-radiating direction of the element becomes large compared to the sectional area perpendicular to the radiating direction. Furthermore, the above-described length in the first direction is larger than the above-described length in the second direction. Therefore, even in a case where the reflectance is not sufficient, an oscillation threshold current is reduced and the luminous efficiency relative to input power can be improved.

Furthermore, in an ordinary laser, it is necessary to provide a region in which a wire is connected to an n-side electrode and a p-side electrode and only a limited part of an element becomes a light-emitting region. According to the semiconductor light-emitting element of the present embodiment, it is possible to make the light-emitting region occupied in the element much larger and the element chip can be effectively used. Therefore, it is possible to increase the number of elements obtained from one wafer by 20 times or so.

By ensuring that the reflectance of the high-reflection layers 201a, 201b relative to the light generated in the active layer 107 is not less than 80%, preferably not less than 95%, the oscillation threshold current is reduced and the luminous efficiency relative to input power can be improved. Furthermore, by ensuring that the reflectance of the low-reflection layer 203 relative to the light generated in the active layer 107 is not more than 10%, the light takeout efficiency can be improved and the luminous efficiency relative to input power can be improved.

Because the n-side electrode 101 which supplies current to the active layer 107 is in contact with a surface parallel to the lamination direction of the above-described laminated section of the n-type GaN contact layer 110 (the face A), it is possible to ensure a wide contact area on this parallel surface. As a result of this, the contact resistance at the metal semiconductor interface can be reduced and the operating voltage of the element can also be reduced.

When the p-side electrode 102 is in contact with a surface parallel to the lamination direction of the above-described laminated section of the p-type GaN contact layer 103 (the surface B), similarly the operating voltage can be reduced. Because in this embodiment, the element has a length in the lamination direction longer than lengths in the first and second directions, it becomes very easy to obtain a wide contact area.

Furthermore, in the semiconductor light-emitting element of this embodiment, the n-side electrode 101 and the p-side electrode 102 are in contact with the element over a wide area compared to an ordinary edge emitting type laser. Therefore, heat dissipating properties are good and current density can be increased.

Next, a method of manufacturing a semiconductor light-emitting element according to this embodiment will be described below. FIG. 3 is a perspective view which shows a method of manufacturing a semiconductor light-emitting element of this embodiment.

First, an n-type GaN substrate is disposed in a crystal growth device. This n-type GaN substrate functions as an n-type GaN contact layer 110 doped with Si. By performing crystal growth which uses the MOCVD process, upon this n-type GaN substrate are formed an n-type $Al_{0.05}Ga_{0.95}N$ clad layer 109 doped with Si, an n-type GaN guide layer 108 doped with Si, an active layer 107 having a multi-quantum well structure in which a well layer is $In_{0.2}Ga_{0.8}N$ and a barrier layer is $In_{0.03}Ga_{0.97}N$, a GaN guide layer 106 which is not doped, a p-type $Al_{0.2}Ga_{0.8}N$ overflow preventing layer 105 doped with Mg, a p-type $Al_{0.05}Ga_{0.95}N$ clad layer 104 doped with Mg, and a p-type GaN contact layer 103 doped with Mg in this order.

Next, the n-type GaN substrate for which such crystal growth has been performed is taken out of the crystal growth device and as shown in FIG. 3A, an $SiO_2$ film 401 is laminated on the p-type GaN contact layer 103.

Next, a resist pattern is formed on the surface of the $SiO_2$ film 401, and by patterning the $SiO_2$ film 401 using this resist pattern, openings formed from rectangles of 5 μm×80 μm are provided lengthwise and crosswise in rows on the $SiO_2$ film 401. The pitch of the multiple openings which are adjacent to each other in the longitudinal direction of the openings is 100 μm and the pitch of the multiple openings which are adjacent to each other in the direction of the short side is 10 μm. Ammonium fluoride is used to remove the $SiO_2$ film 401.

Figure 3B:
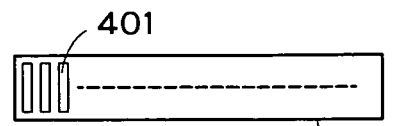

Next, as shown in FIG. 3B, scribe lines are marked along a direction that the openings are disposed on the surface of the n-type GaN substrate. For example, the <11-20> direction is used as the cleavage direction. The scribe lines are marked while observing the surface of the p-type GaN contact layer 103 so that cleavage is formed to avoid the openings on the P-type GaN contact layer 103. The n-type GaN substrate is cleaved along a cleavage plane, with the scribe line serving as the starting point, and separated into multiple bar-like bodies 402. The width of the bar-like body 402 along the short side (the width along the longitudinal direction of the openings) is 100 μm.

Figure 3C:
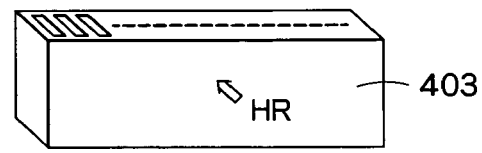

Next, as shown in FIG. 3C, in this state, a dielectric multilayer film 403 is evaporated on the cleavage plane as high-reflection layers 201b, 201a. The dielectric multilayer film 403 is laminated in quantities of 10 pairs in all by repeating $TiO_2/SiO_2$. The reflectance of this dielectric multilayer film 403 is not less than 99% relative to emission wavelength. During the evaporation of the dielectric multilayer film 403, the film thickness of each layer is adjusted so that it becomes a thickness corresponding to ¼ of the central wavelength of the light-emitting layer (the active layer 107). This evaporation is performed for cleavage planes of the bar-like body 402 on both sides.

Figure 3D:
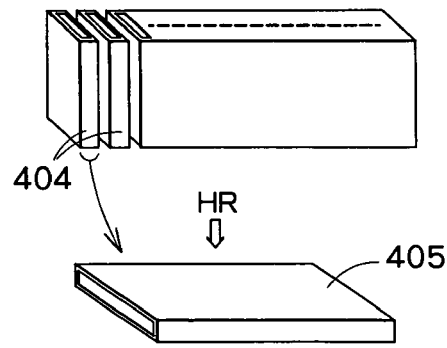

Next, as shown in FIG. 3D, one element chip 404 is fabricated by performing the breaking of the bar-like body 402 in the crosswise direction. This breaking is performed while observing the surface of the P-type GaN contact layer 103 so that cleavage is formed to avoid the openings on the p-type GaN contact layer 103. The width of the element chips 404 (the width along the crosswise direction of the opening) is 10 μm.

By fabricating the element chips 404 by cleavage in this manner, the volume per element can be reduced, and each wafer can be effectively used, with the result that a yield improvement and a cost reduction can be achieved.

Next, in this state, the element chips 404 are arrayed and fixed on a support substrate or a support bed so that the lamination direction becomes horizontal. Furthermore, as shown in FIG. 3E, upon a cleavage plane on one side is evaporated a dielectric multilayer film 405 as a high-reflection layer 202. The dielectric multilayer film 405 is laminated in quantities of 10 pairs in all by repeating $TiO_2/SiO_2$. The reflectance of this dielectric multilayer film 405 is not less than 99% relative to emission wavelength. During the evaporation of the dielectric multilayer film 405, the film thickness of each layer is adjusted so that it becomes a thickness corresponding to ¼ of the central wavelength of the light-emitting layer (the active layer 107).

Figure 3F:
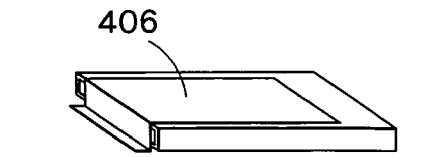

Next, as shown in FIG. 3F, a metal film 406 as a p-side electrode 102 is evaporated from the openings on the p-type GaN contact layer 103 to the surface where the dielectric multilayer film 405 has been formed. In order to increase the area of contact between the p-side electrode 102 and the p-type GaN contact layer 103, it is also possible to provide openings on the surface of the p-type GaN contact layer 103 where the dielectric multilayer film 405 has been formed and to form the metal film 406 so as to bury the openings. The metal film 406 is patterned as required.

Figure 3G:
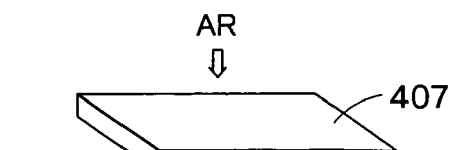

Next, as shown in FIG. 3G, the element chips 404 are moved onto another support substrate or a support bed, and the element chips 404 are arrayed and fixed so that the side where the dielectric multilayer film 405 has been laminated comes into contact with the support substrate or the support bed. Furthermore, as shown in FIG. 3G, a dielectric film 407 is evaporated as a low-reflection layer 203 on a cleavage plane on the opposite side. For example, $SiO_2$ is laminated as the dielectric film 407. The reflectance of this dielectric film 407 is not more than 10% relative to emission wavelength. During the evaporation of the dielectric film 407, the film thickness is adjusted so that it becomes a thickness corresponding to ½ of the central wavelength of the light-emitting layer (the active layer 107).

Figure 3H:
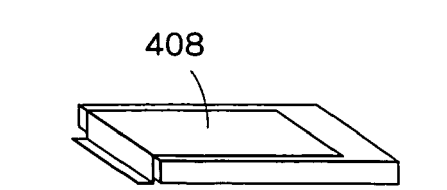

After that, an opening is formed on the surface of the n-type GaN contact layer 110 where the dielectric film 407 has been formed (the surface parallel to the lamination direction of crystal growth). Ammonium fluoride is used to remove the dielectric film ($SiO_2$ film) 407. Next, as shown in FIG. 3H, a metal film 408 as an n-side electrode 101 is buried in the opening which exposes the n-type GaN contact layer 110, and at the same time, the metal film 408 is evaporated over to a surface adjacent to the surface where this opening is provided (the surface parallel to the lamination direction of crystal growth), i.e., the surface perpendicular to the lamination direction of crystal growth. A relatively large opening can be provided in the surface of the n-type GaN contact layer 110 where the dielectric film 407 has been formed (the surface parallel to the lamination direction of crystal growth) and it is possible to increase the area of contact between the n-side electrode 101 and the n-type GaN contact layer 110.

Next, in order to prevent the active layer 107 from being covered with the metal film 408, the metal film 408 is patterned. For example, the lift-off process is used as a patterning method. A resist pattern is formed on a region including the active layer 107 etc. and this resist pattern is removed with an organic solvent or the like after the evaporation of the metal film 408, whereby the patterning of the metal film 408 can be performed.

As described above, in the first embodiment, the light emitted in the active layer 107 is reciprocated in the first direction to increase the optical power, and then the light can be taken out to the outside via the low-reflection layer 203, whereby luminous efficiency can be improved. Also, because the sectional area of the active layer in the second direction, which is the radiation direction of light, is made larger than the sectional area of the active layer in the first direction which is perpendicular to the radiation direction of light, luminous efficiency can be further improved.

Furthermore, because the n-side electrode 101 comes into surface contact with the n-type contact layer 110 and also the p-side electrode 102 comes into surface contact with the p-type GaN contact layer 103, contact resistance can be reduced and the operating voltage of the element can be reduced. Also, because the n-side electrode 101 and the p-side electrode 102 come into contact with the element over a wide area, heat dissipating properties are improved and current density can be increased.

Second Embodiment

Figure 4:
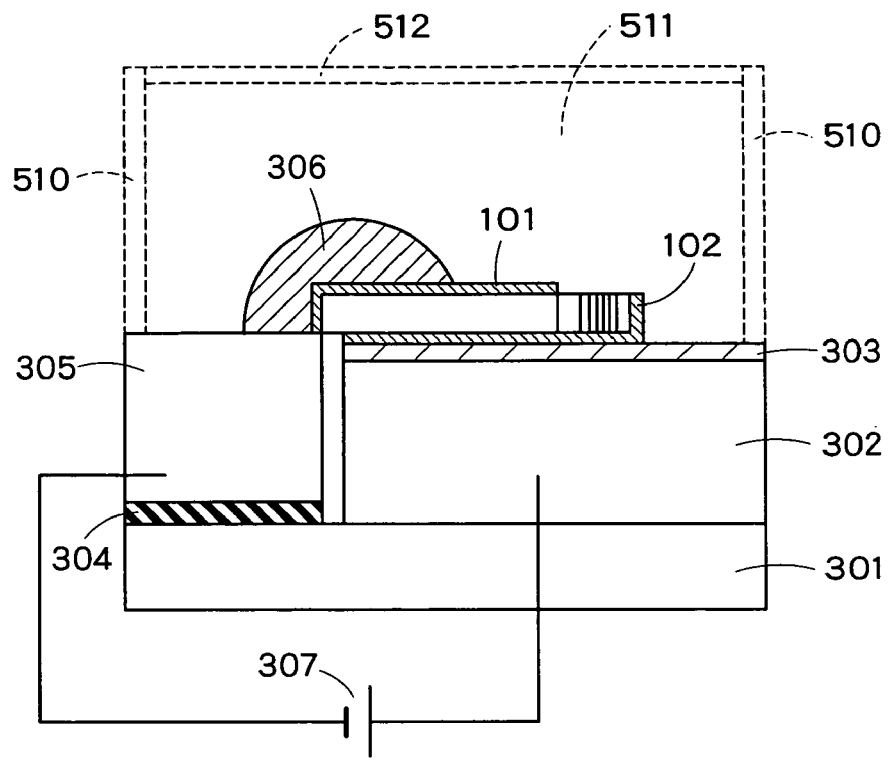
FIG. 4 is a sectional view which shows a structure of a light-emitting device related to the second embodiment of the present invention.

FIG. 4 is a sectional view which shows a structure of a light-emitting device related to the second embodiment of the present invention. In this embodiment, the light-emitting device which has a semiconductor light-emitting element of FIG. 1 mounted on a heat sink will be described. As indicated by solid lines of FIG. 4, a heat sink 302 is disposed in a region of the top surface of a vertically mounted substrate 301 in contact therewith, and a heat sink 305 is disposed in the other region of the top surface of the vertically mounted substrate 301 via an insulator 304. The heat sinks 302, 305 are formed of a conductor. However, the heat sinks 302, 305 are insulated from each other.

The semiconductor light-emitting element shown in FIG. 1 is disposed on the heat sink 302 via a solder 303 so that the surface at a side of laminating a high-reflection layer (a dielectric multilayer film) 202 faces the heat sink 302. The solder 303 is electrically conducted with the portion of a p-side electrode 102 which extends on the dielectric multilayer film 202 and heat sink 302.

A solder 306 is formed between an n-side electrode 101 and the heat sink 305, and the n-side electrode 101 and the heat sink 305 are electrically conducted by this solder 306. The n-side electrode 101 and the heat sink 305 may be electrically conducted by use of an Au wire in place of the solder 306. The reference numeral 307 denotes a power source which applies a voltage across the heat sink 302 and the heat sink 305, and owing to such a structure, a voltage is applied across the n-side electrode 101 and the p-side electrode 102.

With the light-emitting device of the second embodiment, the same effect as described in the first embodiment can be obtained. Besides, heat can be dissipated from the n-side electrode 101 and p-side electrode 102 which are in contact with the element over a wide area into the heat sink 305 and the heat sink 302, respectively via the solder 306 and the solder 303. Because of this, the temperature characteristics and reliability of the element can be improved by further improving heat dissipating properties and operation at a high output becomes possible. Particularly, it is possible to dispose an active layer 107 of large heat generation and the p-side electrode 102 near the heat sink 302 and as a result of this, the heat dissipation efficiency can be remarkably improved and stable operation at a high output is made possible.

Third Embodiment

The third embodiment relates to a light-emitting device for white light emission and is an example of a lighting device which replaces fluorescent lamps and the like. A structure of this device will be described by using FIG. 4. As shown in FIG. 4, in the light-emitting device of this embodiment, members indicated by dotted line are provided in addition to the structure of the second embodiment (the solid line portion of FIG. 4). The reference numeral 510 denotes a plastics cell and the semiconductor light-emitting element of FIG. 1 is disposed within this cell 510. A fluorescent material layer 511 is buried in the interior of the cell 510 on this semiconductor light-emitting element, and a light take-out window 512 is provided so as to cover the fluorescent material layer 511.

The fluorescent material layer 511 is a layer in which a fluorescent material of red color, a fluorescent material of green color and a fluorescent material of blue color are dispersed in a fluorine-based polymer. $La_2O_2S$: Eu, Sm (the elements behind the symbol (:) denote activating elements, and the same applies to the following) and the like are used as a fluorescent material of red color, InGaN, $BaMgAl_{27}O_{17}$: Eu, Mn and the like are used as a fluorescent material of green color, and InGaN, $(Sr, Ca, Ba)_{10}(PO_4)_6Cl_2$: Eu and the like are used as a fluorescent material of blue color. The fluorescent materials of these colors are excited by the light emitted from the semiconductor light-emitting element and light emission occurs, with the result that white light can be obtained by the superimposing of the light emission by the fluorescent materials of each color. Incidentally, it is possible to use a fluorescent material of yellow color in place of a fluorescent material of green color or in combination with a fluorescent material of green color, and for example, (Sr, Ca, Ba)$_2$SiO$_4$:Eu and the like are used.

Although the cell 510 is made of a plastics material here, metals, ceramics and glass may also be used. And when metals, ceramics and glass are used, it is possible to obtain a light-emitting device having good heat dissipating properties and little deteriorates and a high-output, high-reliability light-emitting device can be provided. The fluorescent material layer 511 may be in contact with the semiconductor light-emitting element, it may be disposed outside the cell 510, or it may be disposed between the two.

With the light-emitting device of the third embodiment, the same effects as described in the first and second embodiments can be obtained. Besides, it is possible to obtain a light-emitting device for white light emission having excellent rendering properties and high luminous efficiency. Therefore, it is possible to realize a new lighting system which replaces conventional fluorescent lamps.

Fourth Embodiment

The fourth embodiment is such that in the semiconductor light-emitting element of FIG. 1, a laminated structure of AlGaN/GaN in which the thickness of each layer corresponds to the ¼ wavelength of the emission wavelength in terms of optical path length is used in place of the n-type Al$_{0.05}$Ga$_{0.95}$N clad layer 109.

Figure 5A:
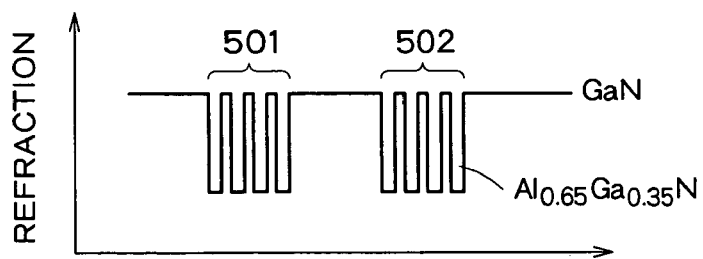
FIGS. 5A and 5B are diagrams which show the refractive-index distribution of this n-type clad layer.
Figure 5B:
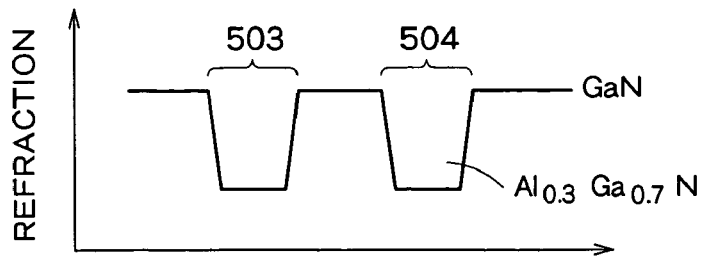

FIGS. 5A and 5B are diagrams which show the refractive-index distribution of this n-type clad layer. In the figures, the abscissa is the position in film thickness direction and the ordinate is the refractive index. As shown in FIG. 5B, the n-type clad layer has a laminated structure in which Al$_{0.3}$Ga$_{0.7}$N layers (503, 504) and GaN layers, which respectively correspond to a thickness of the ¼ wavelength of the emission wavelength in terms of optical path length, are alternately laminated. Owing to this structure, it is possible to reduce the amount of the light from the active layer 107 which leaks to the n-type GaN substrate side (the n-type GaN contact layer 110 side), and luminous efficiency can be improved.

As shown in FIG. 5A, the Al$_{0.3}$Ga$_{0.7}$N layers (503, 504) of FIG. 5B may be constituted respectively by the superlattices (501, 502) of Al$_{0.65}$Ga$_{0.35}$N and GaN so that the refractive-index distribution has a double cycle. It is possible to set the thickness of Al$_{0.65}$Ga$_{0.35}$N and GaN at 4.6 rm and 5 mm, respectively.

According to the light-emitting device of the fifth embodiment, the same effect as in the first embodiment can be obtained. Besides, in the example of FIG. 5B, it is possible to increase the optical output during operation to about three times as high as in conventional semiconductor light-emitting elements, although voltage increases. In the example of FIG. 5A, it is possible to increase the optical output during operation to about three times as high as in conventional semiconductor light-emitting elements and, at the same time, it is possible to ensure that operating voltage has similar values as in conventional semiconductor light-emitting elements.

The p-type Al$_{0.05}$Ga$_{0.95}$N clad layer 104 may have a laminated structure in which AlGaN layers and GaN layers, which respectively correspond to a thickness of the ¼ wavelength of the emission wavelength in terms of optical path length, are alternately laminated. As a result of this, it is possible to reduce the amount of the light from the active layer 107 which leaks to the p-type GaN contact layer 103 side, and luminous efficiency can be improved.

Incidentally, only the n-type Al$_{0.05}$Ga$_{0.95}$N clad layer 109 may have the above-described laminated structure, only the p-type Al$_{0.05}$Ga$_{0.95}$N clad layer 104 may have the above-described laminated structure, or both may have the above-described laminated structure.

Fifth Embodiment

A fifth embodiment has characteristics in which a film made of a nitride-based insulator such as a silicon nitride is provided between the side surfaces of the active layer 107 and the high-reflection layers 201*a*, 201*b*, 202 or the low-reflection layer 203, or the side surfaces of the active layer 107 are subjected to nitriding treatment.

According to the element structure of this embodiment, a nitride-based insulator is provided between the active layer 107 and the high-reflection layers 201*a*, 201*b*, 202 and between the active layer 107 and low-reflection layer 203 formed on the side surfaces of this active layer 107. Therefore, even in a case where a current flows near the side surfaces of the active layer 107, surface recombination is reduced owing to the silicon nitride film, making it possible to reduce reactive current. Thus, it is possible to improve luminous efficiency relative to input power.

Incidentally, a film formed from aluminum nitride and the like may be used in place of silicon nitride. These nitride-based insulators can be formed by CVD and sputtering.

Furthermore, it is preferred that before the formation of a film formed from a nitride-based insulator and the high-reflection layers 201*a*, 201*b*, 202 and the low-reflection layer 203 on the active layer 107 side, the side surfaces of the active layer 107 is subjected to nitriding treatment. This treatment enables a reduction in reactive current and an increase in luminous efficiency to be further improved. As the nitriding treatment, it is preferable to adopt a process which involves performing discharge in a gas such as nitrogen and ammonia, causing a nitrogen radical to be generated by this discharge, and performing surface treatment with this nitrogen radical. Incidentally, only nitriding treatment may also be performed and the side surfaces of the active layer 107 are not always covered with the above-described nitride-based insulator.

Sixth Embodiment

In the semiconductor light-emitting element of a sixth embodiment, a p-type GaN substrate is used in place of the n-type GaN substrate, and the sixth embodiment is the same as the first embodiment except for this point.

FIG. 6 is a perspective view which shows a structure of a semiconductor light-emitting element related to this embodiment. As shown in FIG. 6, the semiconductor light-emitting element of this embodiment is formed from a GaN-based compound semiconductor chip in a rectangular shape. This chip has a structure which is obtained by laminating a p-type GaN contact layer 603 doped with Mg, a p-type Al$_{0.05}$Ga$_{0.95}$N clad layer 604 doped with Mg, a p-type Al$_{0.2}$Ga$_{0.8}$N overflow preventing layer 605 doped with Mg, a GaN guide layer 606 which is not doped, an active layer 607 having a multi-quantum well structure in which a well layer is In$_{0.2}$Ga$_{0.8}$N and a barrier layer is In$_{0.03}$Ga$_{0.97}$, an n-type GaN guide layer 608 doped with Si, an n-type Al$_{0.05}$Ga$_{0.95}$N clad layer 609 doped with Si, and an n-type GaN contact layer 610 doped with Si in this order. A p-side electrode 602 is connected to the p-type GaN contact layer 603, and an n-side electrode 601 is connected to the n-type GaN contact layer 610. An element of such a structure can be manufactured by the same process as in the first embodiment, with the exception that a p-type GaN substrate is used in place of the n-type GaN substrate.

In the element structure of the sixth embodiment, the "p" and "n" of the layer structure in the first embodiment are interchanged, and the same functions and effects as in the first embodiment are obtained. That is, according to this embodiment, it is possible to dramatically increase the area of contact between the p-type GaN contact layer 603 and the p-side electrode 602, and it is possible to substantially reduce contact resistance in the p-side electrode 602 where contact resistance is apt to increase. As a result of this, the operating voltage can be substantially reduced and it is possible to dramatically reduce the heat generation of the element.

It is also possible to fabricate a light-emitting device shown in FIG. 4 by using the semiconductor light-emitting element shown in FIG. 6. By electrically connecting the p-side electrode 602 to the heat sink 305 via the solder 306 and electrically connecting the n-side electrode 601 to the heat sink 302 via the solder 303, it is possible to improve heat dissipation efficiency and to operate the light-emitting device at a high output.

It is also possible to electrically connect the p-side electrode 602 to the heat sink 302 via the solder 303 and to electrically connect the n-side electrode 601 to the heat sink 305 via the solder 306. In this case, the low-reflection layer 203 is replaced with the high-reflection layer 202 so that the n-side electrode 601 does not cover the light radiation surface of the active layer 607. In this case, the heat dissipation efficiency is further improved and it is possible to operate the light-emitting device in a stable manner at a high output.

Seventh Embodiment

Although in the above-described third embodiment, an example has been described in which white light is obtained by applying a fluorescent material to the periphery of the semiconductor light-emitting element, the seventh embodiment described below features an application method of a fluorescent material.

FIG. 7 is a perspective view which shows an example in which the semiconductor light-emitting element of FIG. 1 is mounted on a printed circuit board. Upon a printed circuit board 700 are formed an n-side interconnection pattern 701 and a p-side interconnection pattern 702 which are electrically connected respectively to the n-side electrode 101 and p-side electrode 102 of the semiconductor light-emitting element. These electrodes 101, 102 and interconnection patterns 701, 702 are contacted, for example, by a solder 703. Although this is omitted in FIG. 7, a heat sink as shown in FIG. 4 may be connected to the semiconductor light-emitting element.

Although this is not shown in FIG. 7, with the semiconductor light-emitting element mounted on the printed circuit board 700, a fluorescent material is applied to the whole surface of the substrate. By applying a fluorescent material, the wavelength of the light emitted from the semiconductor light-emitting element is changed and white light can be obtained.

Usually fluorescent materials have the shape of a particle, and when a fluorescent material of this kind is applied to the top surface and side surfaces of the semiconductor light-emitting element, the surface color become uneven due to variations in particle size. To prevent this phenomenon, in this embodiment a fluorescent material is applied directly to the periphery of the active layer of the semiconductor light-emitting element by sputtering. More specifically, a fluorescent material made by an ordinary technique is laminated on the surface of the semiconductor light-emitting element where the electrodes are not formed.

As a concrete technique for laminating a fluorescent material, for example, with the heat sink attached to the semiconductor light-emitting element, sputtering is performed while rotating the semiconductor light-emitting element by a planetary system, whereby the fluorescent material is laminated.

More preferably, a fluorescent material is laminated by laser abrasion. As a result of this, a fluorescent material which is free from variations in particle size and has a good luminous efficiency can be uniformly formed.

When the light emitted from the element is used as part of white light by the partial transmission of the light, a fluorescent material layer is formed thin. When a fluorescent material is excited by ultraviolet light, multiple fluorescent material layers are formed as a laminated structure. It is also possible to laminate fine crystals on another crystal plane in an aqueous solution of zinc chloride or the like. By using such techniques, it is possible to obtain good white light free from color unevenness.

Figure 8:
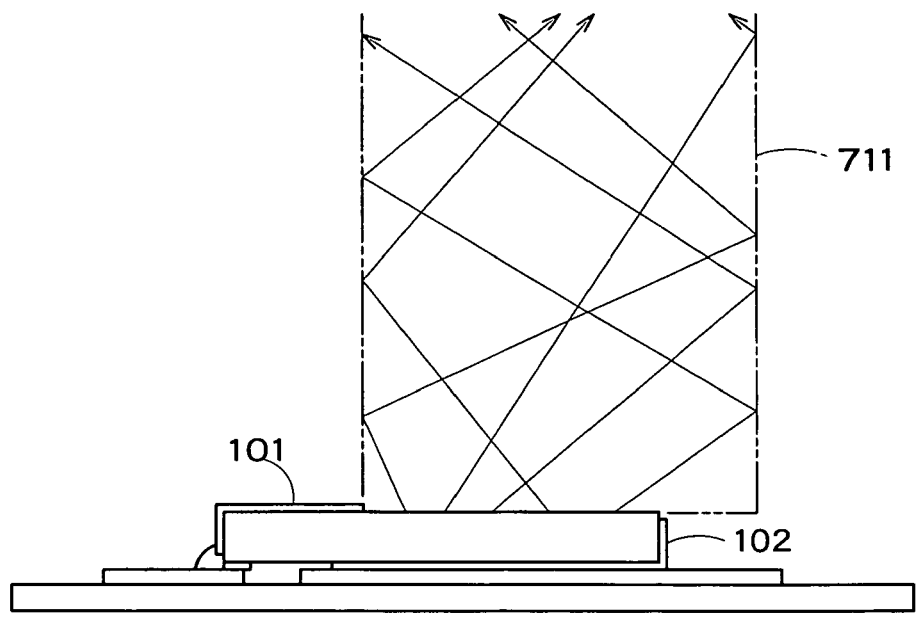
FIG. 8 is a diagram in which a light guiding plate is disposed around an active layer.
Figure 9:
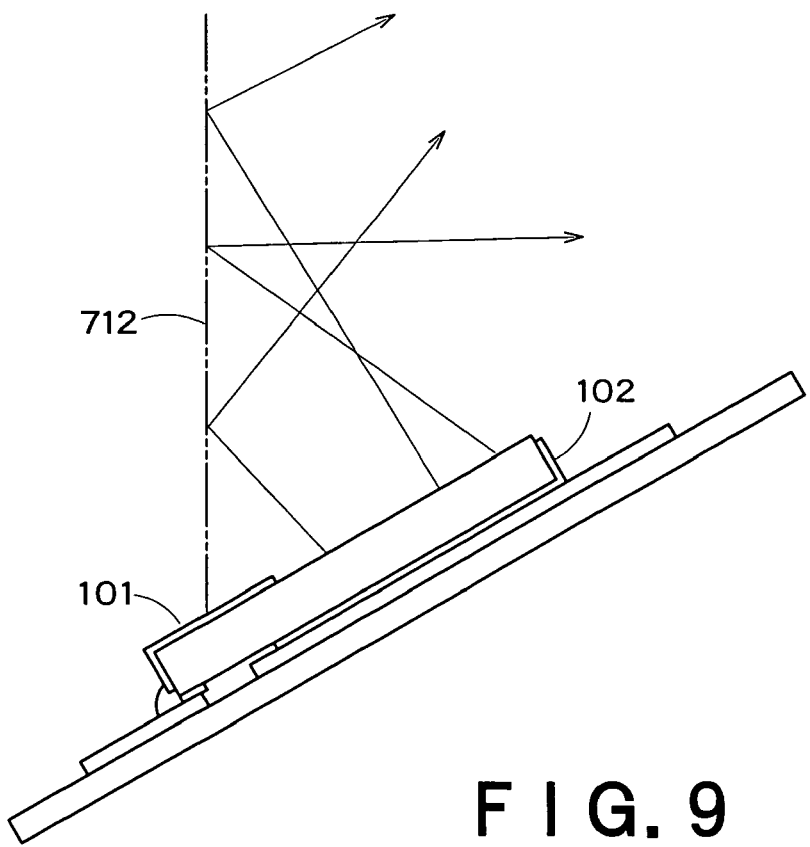
FIG. 9 is a diagram showing an example in which a reflection plate or a diffusion plate is disposed along an emitting direction of a semiconductor light-emitting element.

In a case where a lighting device is to be fabricated by use of the semiconductor light-emitting element in each of the above-described embodiments, if the semiconductor light-emitting element is used as it is, then luminance becomes high only in the periphery of the active layer of the semiconductor light-emitting element and glare occurs. Therefore, as shown in FIG. 8, a light guiding plate 711 may be disposed at the periphery of the active layer so that the density of light is reduced by widening the light-emitting area by this light guiding plate 711. Or alternatively, a shown in FIG. 9, the light-emitting area may be widened by disposing a reflection plate or a diffusion plate 712 along the light-emitting direction of the semiconductor light-emitting element in place of the light guiding plate 711. In the case of FIG. 9, a fluorescent material is applied to the reflection plate and the diffusion plate, instead of applying a fluorescent material to the semiconductor light-emitting element. As a result of this, it is possible to obtain a good white color while reducing the density of light.

The present invention is not limited to the above-described embodiments. For instance, in the example of FIG. 3, when fabricating chips of a semiconductor light-emitting element, first, surfaces on which a pair of high-reflection layers are to be formed are fabricated by cleaving the substrate and the substrate is separated into multiple bar-like bodies, and then surfaces on which high-reflection layers and a low-reflection layer are to be formed are fabricated by cleaving the bar-like bodies, and then the bar-like bodies are separated into multiple element chips. However, this process may be reversed.

That is, it is also possible to adopt the following process. First, scribe lines are formed in the direction corresponding to the longitudinal direction of the element, whereby surfaces on which high-reflection layers and a low-reflection layer are to be formed are fabricated by cleaving the substrate to separate the substrate into multiple bar-like bodies. Next, surfaces on which a pair of high-reflection layers is to be formed are fabricated in each of the bar-like bodies by performing cleavage, and then each of the bar-like bodies is separated into multiple element chips. In the former fabrication process, it is possible to obtain a good efficiency because cleavage planes can be fabricated at a time. In the latter fabrication process, because cleavage planes of the elements are individually formed one after another, accurate cleavage planes are obtained and it is possible to obtain a good yield.

Although in the example of FIG. 3, the separation of the element is performed by scribe and cleavage, it may be performed by dry etching. In this case, a mask pattern is formed on the substrate surface so that the separated regions of the substrate are exposed, and the substrate is dry etched by using this mask pattern. When a substrate formed of a GaN-based material is used, it is possible to use metals, such as $SiO_2$ and Mo, and the like as the mask pattern and argon, chlorine, etc. as an etching gas. On that occasion, the shape shown in FIG. 3D can be obtained by performing etching alone and, therefore, it is possible to reduce the frequency of rearrangement and re-bonding of the element can be reduced.

It is possible to adopt a structure in which the n-side electrode has the shape of a comb. For example, in FIG. 1, the planar shape in the surface A of the n-side electrode 101 can be the shape indicated by the dotted lines. In this case, the light absorption by the reflection in the electrode part can be reduced by reducing the electrode area and it is possible to further suppress the decrease in luminous efficiency by the light absorption in parts other than the light-emitting layer. A structure in which the p-side electrode has the shape of a comb and a structure in which both the n-side electrode and the p-side electrode have the shape of a comb may also be adopted, and the same effect can be obtained in these cases.

Although in the above-described embodiments, GaN is used as the substrate, other substrates, such as a sapphire substrate and an SiC substrate, may be used. An electrode on the substrate side in these cases is formed so as to be in contact with a conductive substrate or laminated layer. For example, in the case of a sapphire substrate, because the substrate has insulating properties, it is possible to adopt a structure in which the electrode is in contact with a conductive semiconductor layer laminated on the substrate. It is also possible to adopt a structure in which the electrode extends from an insulating substrate to a conductive semiconductor layer, and in this case, it is possible to improve heat dissipating properties.

The present invention is not limited to the above-described embodiments as they are, and in the case of implementing the present invention, it is possible to modify and substantiate the constituents of the present invention in a range of not departing from the gist of the invention. Also, it is possible to realize various inventions by properly combining
the multiple constituent elements disclosed in the above-described embodiments. For example, some constituent elements may be eliminated from all the constituent elements shown in the embodiments. Furthermore, constituent elements which cover different embodiments may be arbitrarily combined.

What is claimed is:

1. A semiconductor light-emitting element, comprising:
   a laminated section which has an active layer made of a semiconductor, and first and second clad layers each being disposed to sandwich the active layer and made of a semiconductor;
   a pair of first high-reflection layers each being disposed to sandwich the active layer in a first direction orthogonal to the laminated direction of the laminated section, which have high reflectance relative to a light emitted by the active layer; and
   a low-reflection layer and a second high-reflection layer each being disposed to sandwich the active layer in a second direction orthogonal to the laminated direction and crossing to the first direction, which have low reflectance and high reflectance respectively relative to the light emitted by the active layer.

2. The semiconductor light-emitting element according to claim 1,
   wherein the second direction is orthogonal to the first direction.

3. The semiconductor light-emitting element according to claim 1,
   wherein a sectional area of the active layer in a plane orthogonal to the second direction is larger than the sectional area of the active layer in a plane orthogonal to the first direction.

4. The semiconductor light-emitting element according to claim 1,
   wherein the laminated section has a shape in which a length of the laminated direction is longer than a length in the first direction and a length in the second direction.

5. The semiconductor light-emitting element according to claim 1,
   wherein the first and second clad layers include a pair of third high-reflection layers which have high reflectance relative to the light emitted by the active layer.

6. The semiconductor light-emitting element according to claim 1,
   wherein high reflectance of the first and second high-reflection layers are 80% or more relative to the light emitted by the active layer.

7. The semiconductor light-emitting element according to claim 1,
   wherein reflectance of the low-reflection layer is 10% or less relative to the light emitted by the active layer.

8. The semiconductor light-emitting element according to claim 1,
   wherein the laminated section has first and second contact layers which are formed on opposite sides of the first and second clad layers from the active layer,
   first and second electrodes being provided to supply a current to the active layer via the first and second contact layers, and
   at least one of the first and second electrodes being contacted with a surface parallel to the laminated direction of the laminated section at least one of the first and second contact layers.

9. The semiconductor light-emitting element according to claim 1,
   wherein at least a portion of a side surface of the active layer is covered with a nitride-based insulator.

10. The semiconductor light-emitting element according to claim 9,
    wherein the nitride-based insulator is a silicon nitride.

11. The semiconductor light-emitting element according to claim 1,
    wherein the active layer is made of a nitride-based compound semiconductor.

12. A light-emitting device, comprising:
    a mount substrate which has a heat sink; and
    a semiconductor light-emitting element mounted on the heat sink,
    the semiconductor light-emitting element comprising:
    a laminated section which has an active layer made of a semiconductor, and first and second clad layers each being disposed to sandwich the active layer and made of a semiconductor;

a pair of first high-reflection layers each being disposed to sandwich the active layer in a first direction orthogonal to the laminated direction of the laminated section, which have high reflectance relative to a light emitted by the active layer; and a low-reflection layer and a second high-reflection layer each being disposed to sandwich the active layer in a second direction orthogonal to the laminated direction and crossing to the first direction, which have low reflectance and high reflectance respectively relative to the light emitted by the active layer, the laminated direction of the laminated section being in parallel to a surface of the heat sink on which the semiconductor light-emitting element is disposed.

13. The light-emitting device according to claim 12, further comprising a fluorescent material formed around the active layer of the semiconductor light-emitting element.

14. The light-emitting device according to claim 12, further comprising a light guiding plate, a reflection plate or a diffusion plate disposed around the active layer of the semiconductor light-emitting element.

15. The light-emitting device according to claim 12,
wherein a sectional area of the active layer in a plane orthogonal to the second direction is larger than the sectional area of the active layer in a plane orthogonal to the first direction.

16. The light-emitting device according to claim 12,
wherein the laminated section has a shape in which a length of the laminated direction is longer than a length in the first direction and a length in the second direction.

17. The light-emitting device according to claim 12,
wherein the first and second clad layers include a pair of third high-reflection layers which have high reflectance relative to the light emitted by the active layer.

18. The light-emitting device according to claim 12,
wherein the laminated section has first and second contact layers which are formed on opposite sides of the first and second clad layers from the active layer, first and second electrodes being provided to supply a current to the active layer via the first and second contact layers, and at least one of the first and second electrodes being contacted with a surface parallel to the laminated direction of the laminated section at least one of the first and second contact layers.

19. The light-emitting device according to claim 12,
wherein at least a portion of a side surface of the active layer is covered with a nitride-based insulator.

* * * * *